Figure 1:
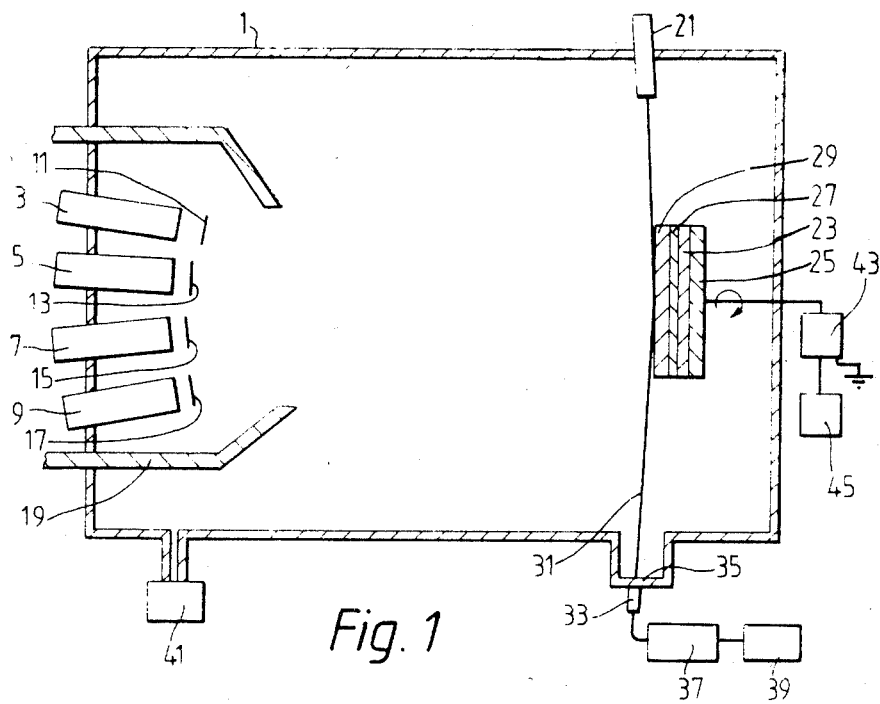

United States Patent [19]

Dobson et al.

[11] Patent Number: 4,575,462
[45] Date of Patent: Mar. 11, 1986

[54] METHOD OF GROWING AN ALLOY FILM BY A LAYER-BY-LAYER PROCESS ON A SUBSTRATE, AND A METHOD OF MAKING A SEMICONDUCTOR DEVICE

[75] Inventors: Peter J. Dobson, Croydon; Charles T. Foxon, Crawley; James H. Neave, Horsham, all of England

[73] Assignee: U.S. Philips Corporation, Tarrytown, N.Y.

[21] Appl. No.: 552,653

[22] Filed: Nov. 17, 1983

[30] Foreign Application Priority Data

Nov. 26, 1982 [GB] United Kingdom ............... 8233778

[51] Int. Cl.⁴ ..................... C30B 23/02; H01L 21/203
[52] U.S. Cl. ........................................ 427/9; 156/601; 156/DIG. 103; 156/610; 427/10; 427/87
[58] Field of Search ............... 427/9, 10, 87; 156/601, 156/610, DIG. 103

[56] References Cited

U.S. PATENT DOCUMENTS

| | | | |
|---|---|---|---|
| 4,036,167 | 7/1977 | Ly | 427/10 |
| 4,137,122 | 1/1979 | Acker | 427/10 |
| 4,233,092 | 11/1980 | Harris | 427/87 |
| 4,383,872 | 5/1983 | Roberts | 427/87 |
| 4,400,407 | 8/1983 | Jones | 427/10 |

OTHER PUBLICATIONS

Ly, "Recent Developments in Monitoring and Controlling Techniques for Alloy, Deposition Processes", Thin Solid Films, vol. 45 (1977), p. 481.

Harris et al, "Oscillations . . . "Surface Science 103 (1981) L90–L91 ©North Holland Publishing Company.

Wood, "Red Intensity Oscillations During MBE of GaAs", Surface Science 108 (1981) L441–L443, North Holland Publishing Company.

Primary Examiner—John D. Smith
Attorney, Agent, or Firm—Paul R. Miller

[57] ABSTRACT

A method of growing an alloy film by a layer-by-layer process on a substrate is described, together with a method of making an semiconductor device in which an alloy film is grown on a substrate by a layer-by-layer process. The atomic ratio of constituents present in the alloy film is determined during growth of the film from the growth rates of the alloy film and of at least one intermediate film consisting of at least one constituent of the alloy. The intermediate film or films are grown between the alloy film and the substrate. During growth of each film, the growth surface is irradiated with a beam of electrons and measurement is carried out of the period of oscillations in the intensity of the stream of electrons diffracted at the growth surface, or specularly reflected by the growth surface, or emitted from the growth surface, or of the current flowing to ground through the substrate. These periods are equal to the respective times taken to grow on a monolayer of the respective film.

11 Claims, 2 Drawing Figures

METHOD OF GROWING AN ALLOY FILM BY A LAYER-BY-LAYER PROCESS ON A SUBSTRATE, AND A METHOD OF MAKING A SEMICONDUCTOR DEVICE

The invention relates to a method of growing an alloy film by a layer-by-layer process on a substrate, and determining the growth rate of the film by irradiating the growing alloy film with a beam of electrons and measuring the period of oscillations in the intensity of the stream of electrons diffracted at the growth surface, or specularly reflected by the growth surface, or emitted from the growth surface, or of the current flowing to ground through the substrate, which period is equal to the growth time of one monolayer of the alloy on the substrate. The invention also relates to a method of making a semiconductor device, in which method an alloy film is grown on a substrate by a layer-by-layer process, and the growth rate of the film is determined by irradiating the growing alloy film with a beam of electrons and measuring the period of oscillations in the intensity of the stream of electrons diffracted at the growth surface, or specularly reflected by the growth surface, or emitted from the growth surface, or of the current flowing to earth through the substrate, which period is equal to the growth time of one monolayer of the alloy on the substrate.

Alloy films may be grown by layer-by-layer processes such as vacuum evaporation or molecular beam processes. Molecular beam epitaxy processes are widely used in the manufacture of semiconductor devices, for example, in the fabrication of laser structures, when it is necessary to deposit III-V alloy films of controlled composition. Hitherto it has not been possible to determine the composition of an alloy film as it is being grown. The fluxes of the alloy constituents which are incident on a substrate have been measured using an ion gauge, or a quartz crystal rate monitor. The compositions of the alloy films have been measured after the substrates bearing the films have been removed from the growth systems.

An article "Oscillations in the surface structure of Sn-doped GaAs during growth by MBE" by J. J. Harris, B. A. Joyce and P. J. Dobson in *Surface Science* 103 (1981) L90–L96 states that the presence of predeposited or surface-accumulated Sn during MBE growth of GaAs modifies the reconstruction of the (001) GaAs surface, as observed by RHEED, at coverages as low as 0.025 monolayer. It was found that when growth was initiated on such a surface, oscillations in the intensity modulation of some of the RHEED streaks occur, with a period equal to the monolayer deposition time of the GaAs. An article "RED intensity oscillations during MBE of GaAs" by Colin E. C. Wood in *Surface Science* 108 (1981) L441–L443 states that while the presence of tin is correctly identified in the J. J. Harris et al article as the cause of the oscillation, Wood has found that the pseudo static modulation of (100) oriented c(2×8) surface reconstruction towards "(2×3)" and "(1×2)" and eventually "(1×1)" surfaces to be a universal effect accompanying heavy n or p type doping, occurring for heavy ($\geqq 2\%$ $J_{Ga}$) incident fluxes of Si, Ge, Sn, PbS and PbSe at substrate temperatures at and below 570° C. Wood also observed that in unpublished work he had found that the time dependent RED streak modulation on arsenic stabilized (2×4) (100) tin-accumulated surfaces was also observed although to a lesser extent, on nominally undoped surfaces.

An object of the invention is to provide a method of determining the composition of an alloy film during growth of the film by a layer-by-layer process.

A method according to the invention of growing an alloy film by a layer-by-layer process on a substrate, is characterized in that at least one intermediate film consisting of at least one constituent of the alloy is grown between the substrate and the alloy film, that the growth rate of the/each intermediate film is determined by irradiating the growing intermediate film with a beam of electrons and measuring the period of oscillations in the intensity of the stream of electrons diffracted at the growth surface, specularly reflected by the growth surface, or emitted from the growth surface, or of the current flowing to ground through the substrate, and that the atomic ratio of constituents present in the alloy is calculated from the growth rates of the alloy film and of the intermediate film(s). The layer-by-layer process may be, for example, a vacuum evaporation process or a molecular beam epitaxy process.

Since the growth rate of a film of an alloy $A_xB_{1-x}$ is determined by the sum of the growth rates of the constituents A and B, it follows that the composition of the alloy can be determined by measuring the growth rates of a buffer layer of the element A on a substrate and of the alloy AB film grown on this buffer layer, by measuring the periods of the above-mentioned oscillations to determine the respective growth rates $R_A$ and $R_{AB}$. The atomic fraction x of the element A present in the film of the alloy is given by $$x = R_A/R_{AB}.$$

The atomic fraction $(1-x)$ of the element B is given by $$(1-x) = (R_{AB} - R_A)/R_{AB}.$$

Apparatus used for growing films by molecular beam processes commonly includes an electron gun and a reflection electron difraction screen in order to monitor the cleanness of the substrate surface and the structure of the growth surface. Such apparatus will not require any additional items such as ion gauges within the growth system in order to perform a method according to the invention.

When the alloy is a binary alloy AB, a method according to the invention comprises the steps of growing a buffer layer of A on the substrate and determining the growth rate of the buffer layer, growing a film of the alloy AB on the buffer layer by continuing to deposit A on the growth surface without changing the conditions of the source supplying A and additionally depositing constituent B of the alloy on the growth surface, determining the growth rate of the alloy AB film, and calculating the ratio of the growth rate of the buffer layer to the growth rate of the alloy film which ratio is equal to the atomic fraction of A present in th alloy AB. Such a binary alloy film may be, for example, a metal alloy film, such as an Ag-Au film grown by vacuum evaporation on a silver buffer layer on a (111) NaCl layer present on a mica support, or a silicon-germanium film grown on a silicon support. When growing a silicon-germanium film, a silicon buffer layer may be used.

When the alloy is a ternary III-V alloy ABC in which the elements A and C are group III elements, a method according to the invention comprises the steps of growing a buffer layer of the compound AB on the substrate and determining the growth rate of the buffer layer, growing the film of the alloy ABC by continuing to supply the species A and B to the growth surface without changing the conditions of the sources supplying the species A and B and additionally supplying species C to the growth surface, determining the growth rate of the film of the alloy ABC, calculating the growth rate of the constituent BC of the alloy ABC by substracting the growth rate of the buffer layer AB from the growth rate of the alloy film ABC, and calculating the ratio of the growth rate of the compound AB to the growth rate of the constituent BC, which ratio is equal to the atomic ratio A:C in the alloy film ABC. The alloy ABC may be, for example, $Ga_{1-x}AsAl_x$, when $1 > x > 0$.

A useful set of oscillations in the intensity of a stream of electrons diffracted at or specularly reflected by or emitted from the growth surface or flowing to earth through the substrate is observable at the start of growth, or may be produced, for example, by momentarily interrupting and then restarting a species flow onto a growth surface when growing a buffer layer. The intensity of these oscillations falls quite rapidly, but resumes at a useful level after such an interruption and restart. When a flow of a further species onto the growth surface is started, a useful set of oscillations is obtained without it being necessary subsequently to interrupt and restart this further species flow.

It is not possible to use a method according to the invention to determine the ratio of two group V elements present in a III-V alloy containing two group V elements. There is not a similar limitation in II-VI or IV-VI alloys, since the sticking coefficients of both the group II and group VI elements, and of the group IV and group VI elements, in the growth of the respective elements, are interdependent.

When the alloy is a quaternary III-V alloy ABCD in which elements A and B belong to different groups of the periodic table, and elements A, C and D belong to group III, a method according to the invention comprises the steps of growing a buffer layer of a compound AB on the substrate and determining the growth rate of the buffer layer, growing a film of an alloy ABC on the buffer layer by continuing to supply species A and B to the growth surface without changing the conditions of the sources supplying the species A and B and additionally supplying species C to the growth surface, determining the growth rate of the film of the alloy ABC, growing a film of the alloy ABCD on the alloy film ABC by continuing to supply species A, B and C to the growth surface without changing the conditions of the sources A, B and C and additionally supplying species D to the growth surface, and determining the growth rate of the film of the alloy ABCD, calculating the growth rates of the compounds BC and BD by subtracting the growth rates of the buffer layer and of the film ABC from the growth rates of the films ABC and ABCD respectively, and calculating the ratios of the growth rate of the buffer layer to the growth rate of the compound BC to the growth rate of the compound BD, which ratios are equal to the ratios of the atomic ratios A:C:D in the alloy film ABCD.

A method according to the invention of making a semiconductor device, for example, an injection laser, is characterized in that at least one intermediate film of at least one constituent of the alloy is grown between the substrate and the alloy film, that the growth rate of the/each intermediate film is determined by irradiating the growing intermediate film with a beam of electrons and measuring the period of oscillations in the intensity of the stream of electrons diffracted at the growth surface specularly reflected by the growth surface, or emitted from the growth surface, or of the current flowing to ground through the substrate, and that the atomic ratio of constituents present in the alloy is calculated from the growth rates of the alloy film and of the intermediate film(s).

When the alloy is a quaternary III-V alloy ABCD in which elements A and C belong to group III and elements B and D belong to group V, a method according to the invention comprises the steps of growing a buffer layer of a compound AB on the substrate and determining the growth rate of the buffer layer, growing a film of the alloy ABCD on the buffer layer AB by continuing to supply the species A and B to the growth surface without changing the conditions of the sources of A and B and additionally supplying species C and D to the growth surface, determining the growth rate of the film ABCD, calculating the growth rate of a compound CD by subtracting the growth rate of the buffer layer AB from the growth rate of the film ABCD, and calculating the ratio of the growth rate of the compound AB to the growth rate of the compound CD, which ratio is equal to the atomic ratio A:C in the alloy film ABCD.

When the alloy is a ternary II-VI or IV-VI alloy ABC in which the elements A and C belong to the same group of the periodic table, a method according to the invention comprises the steps of growing a film of A on the substrate and determining the growth rate of the film A, growing a film of a compound AB on the film A by continuing to supply species A to the growth surface without changing the conditions of the source supplying the species A and additionally supplying species B to the growth surface, determining the growth rate of the film AB, growing a film of the alloy ABC on the film of the alloy AB by continuing to supply the species A and B to the growth surface without changing the conditions of the sources supplying the species A and B and additionally supplying species C to the growth surface, determining the growth rate of the film of the alloy ABC, calculating the growth rate of the constituent B and C by subtracting the growth rates of the films of A and AB from the growth rate of the films AB and ABC respectively, and calculating the ratios of the growth rates of the constituents A:B:C, which ratios are equal to the atomic ratios A:B:C in the alloy ABC. The ternary alloy ABC may be, for example, cadmium mercury telluride grown on a cadmium telluride substrate, lead tin telluride on a lead telluride substrate, or gallium aluminium arsenide grown on a gallium arsenide buffer layer on a germanium or a gallium arsenide substrate.

When the alloy ABCD is a quaternary II-VI or IV-VI alloy, in which alloy elements A and B belong to different groups of the periodic table, a method according to the invention comprises the steps of growing a film of A on the substrate and determining the growth rate of the film A, growing a film of a compound AB on the film A by continuing to supply species A to the growth surface without changing the conditions of the source supplying the species A and additionally supplying species B to the growth surface, determining the growth rate of the film AB, growing a film of an alloy ABC on the film AB by continuing to supply species A and B to the growth surface without changing the conditions of the sources supplying the species A and B and additionally supplying species C to the growth surface, determining the growth rate of the film of the alloy ABC, growing a film of the alloy ABCD on the alloy film ABC by continuing to supply species A, B and C to the growth surface without changing the conditions of the sources A, B and C and additionally supplying species D to the growth surface, and determining the growth rate of the film of the alloy ABCD, calculating the growth rates of the constituents B, C and D by subtracting the growth rates of the films A, AB and ABC from the growth rates of the films AB, ABC and ABCD respectively, and calculating the ratios of the growth rates of the constituents A:B:C:D, which ratios are equal to the atomic ratios A:B:C:D in the alloy ABCD. Such an alloy may be, for example, lead tin selenide telluride.

When an alloy film is grown by a method according to the invention in a growth system provided with control means, for example, a minicomputer, the composition of the alloy film may be controlled by feeding input signals derived from the oscillations in the intensity of the stream of electrons diffracted from, or specularly reflected at, or emitted from the growth surface, or flowing to ground through the substrate into the control means, which input signals are compared by the control means with a preset value corresponding to a desired alloy composition, and wherein the control means adjust the operation of sources of constituent elements of the alloy supplying these elements to the alloy film growth surface until the input signals correspond to the preset value.

When a superlattice structure, for example a multi-quantum well structure or a D.H. laser structure, is grown by a molecular beam epitaxy process, the thickness of each film of the structure may be controlled by feeding input signals derived from the oscillations in the intensity of the stream of electrons diffracted from, or specularly reflected at, or emitted from the growth surface, or flowing to ground through the substrate, into the control means, and the control means are programmed to open and close shutters in front of effusion cells in sequence corresponding to the thickness and composition of constituent films of the structure. Such a superlattice structure may consist, for example, of 100 units of a combination of four monolayers (each 2.83 Å thick) of GaAs and five monolayers of $Ga_{0.5}Al_{0.5}As$ (each 2.83 Å thick), and might be used as part of a short wavelength laser structure. The control means may also be used to control the composition of the $Ga_{0.5}Al_{0.5}As$ films as described above.

When the growth is determined by a reflection electron diffraction technique, it is preferred to monitor the oscillations in the intensity of the specularly reflected beam, since the intensity variations of this beam are larger than the intensity variations of individual diffracted beams.

During the investigations which led to the present invention, it was found that when growing gallium aluminium arsenide films on substrates at different temperatures, useful oscillations in the intensities of streams of diffracted and specularly reflected electrons were produced over the whole range of growth temperatures investigated, namely from 500° to 750° C. It was found that the amplitude of the oscillations decreased as the substrate temperature increased.

It was preferred to measure the growth rate of a buffer layer some time after the beginning of growth of the layer, by momentarily interrupting growth of the layer so as to generate a new set of oscillations on a surface which is rather cleaner than the original substrate surface.

Figure 2:
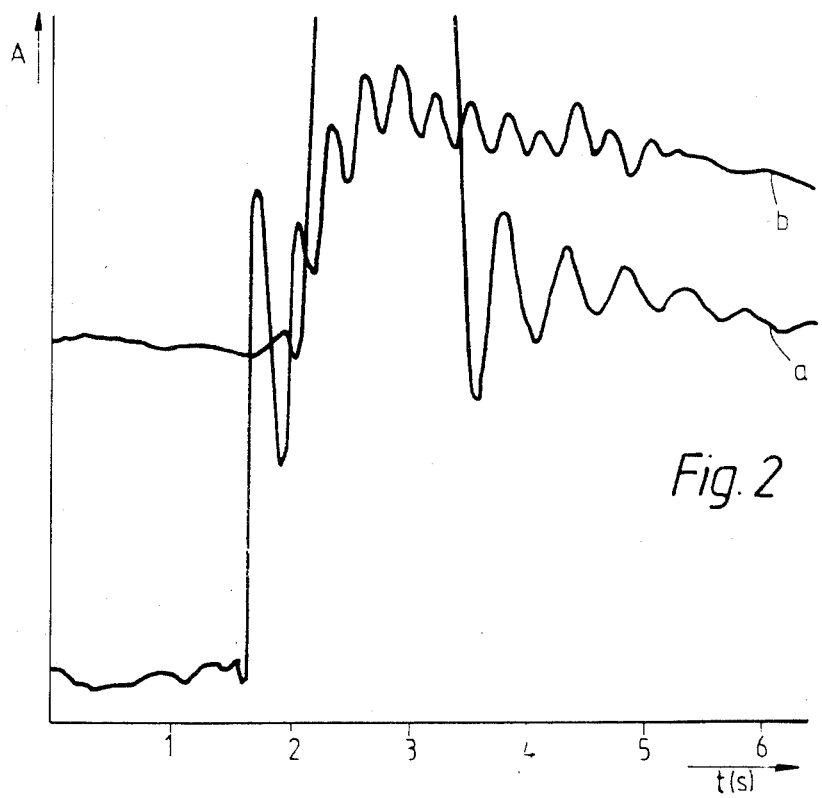

An embodiment of the invention will now be described with reference to an Example and to the drawing, in which:

FIG. 1 is a schematic side sectional elevation of a molecular beam epitaxy apparatus used to perform a method according to the invention, and FIG. 2 is a graph on which part of a recorder trace of the intensity of a specularly reflected beam in a RHEED pattern is shown for growth of part of a buffer layer of GaAs and part of a (Ga,Al)As film grown on this buffer layer.

EXAMPLE

Referring to FIG. 1, a molecular beam epitaxy apparatus was used comprising a vacuum chamber 1 provided with effusion cells 3, 5, 7 and 9 each provided with a respective independently operable shutter 11, 13, 15 and 17, the cells and shutters being disposed within a shroud 19 cooled by liquid nitrogen. The apparatus includes an electron gun 21 used to irradiate a substrate 23 mounted on a rotatable substrate holder 25, in order to monitor the substrate cleaning and to determine the growth rate of a GaAs film 27 grown on the substrate 23 and to determine the growth rate of a (Ga,Al)As film 29 grown over the GaAs film 27.

The growth rates were determined by measuring the period of oscillations in the intensity of a beam 31 of 12 keV electrons which was specularly reflected from the growth surface on to a reflection electron diffraction screen 35 and photons from the screen 35 were detected on a photodetector 33. The signals from the photodetector 33 were amplified by means of an amplifier 37 and were displayed as a trace on a display 39.

The vacuum chamber 1 was exhausted by means of a pump system 41. The effusion cells 3, 5, 7 and 9 which were loaded with gallium, arsenic, aluminium, and a dopant respectively were heated to the required temperatures to produce desired fluxes, all the shutters 11, 13, 15 and 17 being closed during this stage. A GaAs substrate 23 was heated to 590° C., and the shutter 13 was opened so that the substrate 23 was exposed to an $As_2$ flux of $4 \times 10^{15}$ atoms/cm²/sec. for 20 minutes. The temperature of the substrate 23 was then reduced to 550° C., and the shutter 11 was then opened so that the substrate 23 was then exposed to a gallium flux of $1.22 \times 10^{15}$ atoms/cm²/sec. After a short period (of the order of 10 seconds), a normally reconstructed surface pattern was observed on the screen 35. The shutter 11 was then momentarily closed so as to interrupt the gallium flux, and immediately after the gallium flux was restarted by opening the shutter 11, oscillations in the intensity of the specularly reflected beam 31 were observed on the display 39. Curve (a) in FIG. 2 shows a recorder trace obtained on the display 39 at this stage. This curve (a) is a plot of the intensity (measured in arbitrary units) of the specularly reflected beam 31 of electrons with time t (seconds), and the period of these oscillations is the time of growth of one monolayer of GaAs which is 2.83 Å thick. After the GaAs film 27 had grown to a thickness of 100 nm, the shutters 15 and 17 were opened releasing fluxes of $8.7 \times 10^{14}$ atoms/cm²/sec of aluminium and $4.3 \times 10^8$ atoms/cm²/sec of the Sn, which fluxes were then incident on the GaAs film 27 and resulted in the growth of the lightly tin-doped (Ga,Al)As film 29. Immediately after opening the shutter 15, a curve (b) shown in FIG. 2 was observed on the display 39. A monolayer of (Ga,Al)As is also 2.83 Å thick.

The results shown in FIG. 2 give periods of oscillations during growth of the GaAs and (Ga,Al)As layers of 0.51 and 0.30 seconds respectively, and these periods correspond to growth rates of 1.99 μm per hour of GaAs and of 3.40 μm per hour of (Ga,Al)As (these growth rates have an accuracy of ±0.01 μm/hour). Since the lattice constants of GaAs and AlAs are similar—they only vary by about 1%, the growth rate of (Ga,Al)As is the arithmetical sum of the growth rates of GaAs and AlAs. Subtracting the GaAs growth rate from the (Ga,Al)As growth rate gives an AlAs growth rate of 1.41 μm/hour. Thus the composition of the (Ga,Al)As grown was calculated to be $Ga_{0.585}Al_{0.415}As$. The aluminium fraction of the film 29 was found to be 0.404 when measured by surface photovoltage, and an ion gauge flux monitor (not shown) used in the growth system gave an aluminium fraction of 0.405 (these aluminium fractions were accurate to ±0.01).

Instead of determining the growth rates of the films 27 and 29 by measuring the period of the oscillations in the intensity of the specularly reflected beam 31, the period of oscillations in the intensity of the diffracted pattern may be measured when the photodetector 33 has been moved to an appropriate position on the reflection electron diffraction screen 35. Alternatively the period of oscillations in the intensity of the current flowing through the substrate 23 to earth may be measured. This current is of the order of a few μA and the amplitude of the oscillations in this current are of the order of a few tenths of a microampère. A signal derived from this current is amplified by means of an amplifier 43 and the amplified signals were displayed as a trace on a display 45.

We claim:

1. A method of growing an alloy film by a layer-by-layer process on a substrate, and determining the growth rate of the alloy film by irradiating the growing alloy film with a beam of electrons and measuring the period of oscillations in the intensity of the stream of electrons diffracted at the growth surface or specularly reflected by the growth surface, or emitted from the growth surface, or of the current flowing to ground through the substrate, which period is equal to the growth time of one monolayer of the alloy on the substrate, characterized in that at least one intermediate film consisting of at least one constituent of the alloy is grown between the substrate and the alloy film, that the growth rate of said intermediate film is determined by irradiating the growing intermediate film with a beam of electrons and measuring the period of oscillations in the intensity of the stream of electrons diffracted at the growth surface, specularly reflected by the growth surface, or emitted from the growth surface, or of the current flowing to ground through the substrate, and that the atomic ratio of constituents present in the alloy is calculated from the growth rates of the alloy film and of the intermediate film(s).

2. A method of making a semiconductor device, in which method an alloy film is grown on a substrate by a layer-by-layer process, and the growth rate of the alloy film is determined by irradiating the growing alloy film with a beam of electrons and measuring the period of oscillations in the intensity of the stream of electrons diffracted at the growth surface or specularly reflected by the growth surface, or emitted from the growth surface, or of the current flowing to ground through the substrate, which period is equal to the growth time of one monolayer of the alloy on the substrate, characterized in that at least one intermediate film of at least one constituent of the alloy is grown between the substrate and the alloy film, that the growth rate of said intermediate film is determined by irradiating the growing intermediate film with a beam of electrons and measuring the period of oscillations in the intensity of the stream of electrons diffracted at the growth surface, specularly reflected by the growth surface, or emitted from the growth surface, or of the current flowing to ground through the substrate, and that the atomic ratio of constituents present in the alloy is calculated from the growth rates of the alloy film and of the intermediate film(s).

3. A method according to claim 1 or claim 2, characterized in that the layer-by-layer process is a molecular beam epitaxy process.

4. A method according to claim 1 or claim 2, characterized in that the alloy is a ternary III-V alloy ABC in which the elements A and C are group III elements, and that the method comprises the steps of growing a buffer layer of the compound AB on the substrate and determining the growth rate of the buffer layer, growing the film of the alloy ABC by continuing to supply the species A and B to the growth surface without changing the conditions of the sources supplying the species A and B and additionally supplying species C to the growth surface, determining the growth rate of the film of the alloy ABC, calculating the growth rate of the constituent BC of the alloy ABC by subtracting the growth rate of the buffer layer AB from the growth rate of the alloy film ABC, and calculating the ratio of the growth rate of the compound AB to the growth rate of the constituent BC, which ratio is equal to the atomic ratio A:C in the alloy film ABC.

5. A method according to claim 1 or claim 2, characterized in that the alloy is a quaternary III-V alloy ABCD in which elements A and B belong to different groups and elements A, C and D belong to group III, and that the method comprises the steps of growing a buffer layer of a compound AB on the substrates and determining the growth rate of the buffer layer, growing a film of an alloy ABC on the buffer layer by continuing to supply species A and B to the growth surface without changing the conditions of the sources supplying the species A and B and additionally supplying species C to the growth surface, determining the growth rate of the film of the alloy ABC, growing a film of the alloy ABCD on the alloy film ABC by continuing to supply species A, B and C to the growth surface without changing the conditions of the sources A, B and C and additionally supplying species D to the growth surface, and determining the growth rate of the film of the alloy ABCD, calculating the growth rates of the compounds BC and BD by subtracting the growth rates of the buffer layer and of the film ABC from the growth rates of the films ABC and ABCD respectively, and calculating the ratios of the growth rate of the buffer layer to the growth rate of the compound BC to the growth rate of the compound BD, which ratios are equal to the ratios of the atomic ratios A:C:D in the alloy film ABCD.

6. A method according to claim 1 or claim 2, characterized in that the alloy is a quaternary III-V alloy ABCD in which elements A and C belong to group III and elements B and D belong to group V, and that the method comprises the steps of growing a buffer layer of a compound AB on the substrate and determining the growth rate of the buffer layer, growing a film of the alloy ABCD on the buffer layer AB by continuing to supply the species A and B to the growth surface without changing the conditions of the sources of A and B and additionally supplying species C and D to the growth surface, measuring the growth rate of the film ABCD, calculating the growth rate of a compound CD by subtracting the growth rate of the buffer layer AB from the growth rate of the film ABCD, and calculating the ratio of the growth rate of the compound AB to the growth rate of the compound CD, which ratio is equal to the atomic ratio A:C in the alloy film ABCD.

7. A method according to claim 1 or claim 2, characterized in that the alloy is a ternary II-VI or IV-VI alloy ABC in which the elements A and C belong to the same group of the periodic table, and that the method comprises the steps of growing a film of A on the substrate and determining the growth rate of the film A, growing a film of a compound AB on the film A by continuing to supply species A to the growth surface without changing the conditions of the source supplying the species A and additionally supplying species B to the growth surface, determining the growth rate of the film AB, growing a film of the alloy ABC on the film of the alloy AB by continuing to supply the species A and B to the growth surface without changing the conditions of the sources supplying the species A and B and additionally supplying species C to the growth surface, determining the growth rate of the film of the alloy ABC, calculating the growth rate of the constituents B and C by subtracting the growth rate of the films of A and AB from the growth rates of the films AB and ABC respectively, and calculating the ratios of the growth rates of the constituents A:B:C, which ratios are equal to the atomic ratios A:B:C in the alloy ABC.

8. A method according to claim 3, characterized in that the alloy is a quaternary alloy ABCD which is a quaternary II-VI or, IV-VI alloy, in which alloy elements A and B belong to different groups of the periodic table, and that the method comprises the steps of growing a film of A on the substrate and determining the growth rate of the film A, growing a film of a compound AB on the film A by continuing to supply species A to the growth surface without changing the conditions of the source supplying the species A and additionally supplying species B to the growth surface, measuring the growth rate of the film AB, growing a film of an alloy ABC on the film AB by continuing to supply species A and B to the growth surface without changing the conditions of the sources supplying the species A and B and additionally supplying species C to the growth surface, determining the growth rate of the film of the alloy ABC, growing a film of the alloy ABCD on the alloy film ABC by continuing to supply species A, B and C to the growth surface without changing the conditions of the sources A, B and C and additionally supplying species D to the growth surface, and determining the growth rate of the film of the alloy ABCD, calculating the growth rates of the constituents B, C and D by subtracting the growth rates of the films A, AB and ABC from the growth rates of the films AB, ABC and ABCD respectively, and calculating tthe ratios of the growth rates of the constituents A:B:C:D, which ratios are equal to the atomic ratios A:B:C:D in the alloy ABCD.

9. A method according to claim 1 or claim 2, in which the layer-by-layer process is controlled by control means, characterized in that input signals derived from the oscillations in the intensity of the stream of electrons diffracted at or specularly reflected by, or emitted from the growth surface, or flowing to ground through the substrate are fed into the control means, which input signals are compared by the control means with preset signals corresponding to a desired alloy composition, and that the control means adjust the operation of sources of constituent elements of the alloy supplying these elements to the alloy film growth surface until the input signals correspond to the preset signals.

10. A method according to claim 1, characterized in that the layer-by-layer process is a vacuum evaporation process.

11. A method according to claim 1 or claim 10, characterized in that the alloy is a binary alloy AB, and that the method comprises the steps of growing a buffer layer of A on the substrate and determining the growth rate of the buffer layer, growing a film of the alloy AB on the buffer layer by continuing to deposit A on the growth surface without changing the conditions of the source supplying A and additionally depositing constituent B of the alloy on the growth surface, determining the growth rate of the alloy AB film, and calculating the ratio of the growth rate of the buffer layer to the growth rate of the alloy film, which ratio is equal to the atomic fraction of A present in the alloy AB.

* * * * *